United States Patent [19]

Rapp

[11] 4,395,774
[45] Jul. 26, 1983

[54] LOW POWER CMOS FREQUENCY DIVIDER

[75] Inventor: Adolph K. Rapp, Los Gatos, Calif.

[73] Assignee: National Semiconductor Corporation, Santa Clara, Calif.

[21] Appl. No.: 224,591

[22] Filed: Jan. 12, 1981

[51] Int. Cl.³ .................... H03K 23/08; H03K 19/096
[52] U.S. Cl. .................................... 377/114; 307/452; 307/481; 307/576; 377/121
[58] Field of Search ........... 307/220 C, 221 C, 223 C, 307/225 C, 452, 481, 576, 579, 583, 585, 269, 271; 368/157, 159, 219; 377/114, 121, 122

[56] References Cited

U.S. PATENT DOCUMENTS

| | | | |
|---|---|---|---|
| 3,749,937 | 7/1973 | Rogers | 307/579 X |
| 3,922,568 | 11/1975 | Hama | 307/481 X |
| 3,939,642 | 2/1976 | Morozumi | 307/225 C X |
| 3,958,187 | 5/1976 | Suzuki et al. | 368/159 X |
| 3,973,139 | 8/1976 | Dingwall | 307/452 X |
| 4,101,790 | 7/1978 | Ebihara et al. | 307/269 X |

Primary Examiner—John S. Heyman
Assistant Examiner—David R. Hudspeth
Attorney, Agent, or Firm—Gail W. Woodward; Paul J. Winters; Neil B. Schulte

[57] ABSTRACT

Means are described for generating a pair of oscillator signals that will respectively drive P and N channel transistors in Class B. These signals are used to clock a synchronous inverter stage that will only change state during the appropriate time interval. Pairs of such stages are cascaded using common clocking to create a shift register which drives an output inverter, the output of which is coupled back to the input of the register. The output stage also has series-coupled P and N-channel transistor pairs for each pair of clocked inverters. Each transistor pair has its gates driven by the respective pair of clocked inverters. The output stage switches at a frequency which is a submultiple of the oscillator frequency, with the submultiple being equal to the number of inverters minus one. Since the inverters are fully Class B there is no direct current conduction due to simultaneous transistor conduction. The clock input capacitance of the shift register becomes part of the oscillator turning capacitance and thus requires no power dissipation. Furthermore, since the inverters switch at a submultiple of the oscillator frequency, output capacitance charging and discharging power is made negligible.

2 Claims, 4 Drawing Figures

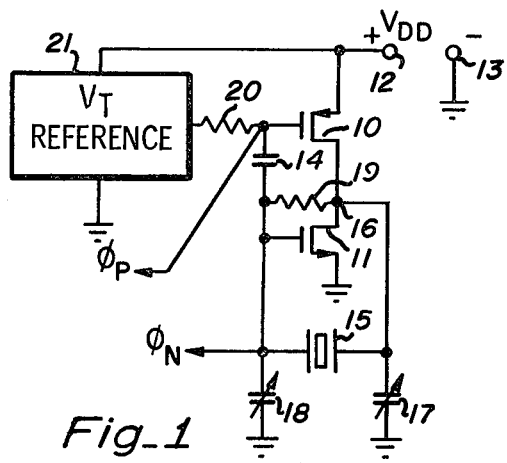
Fig_1
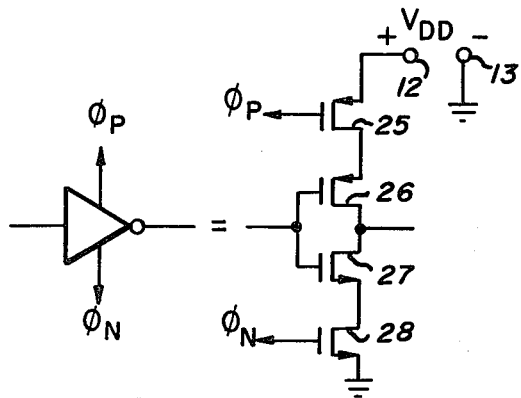
Fig_2
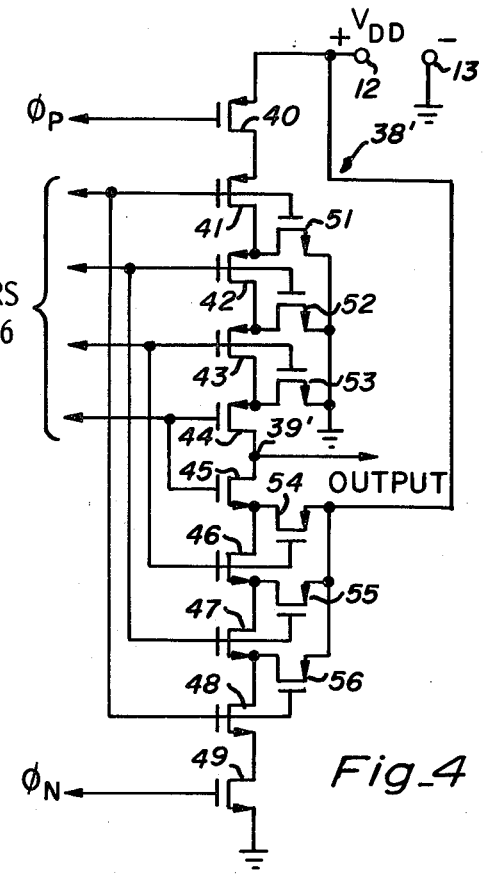
Fig_4
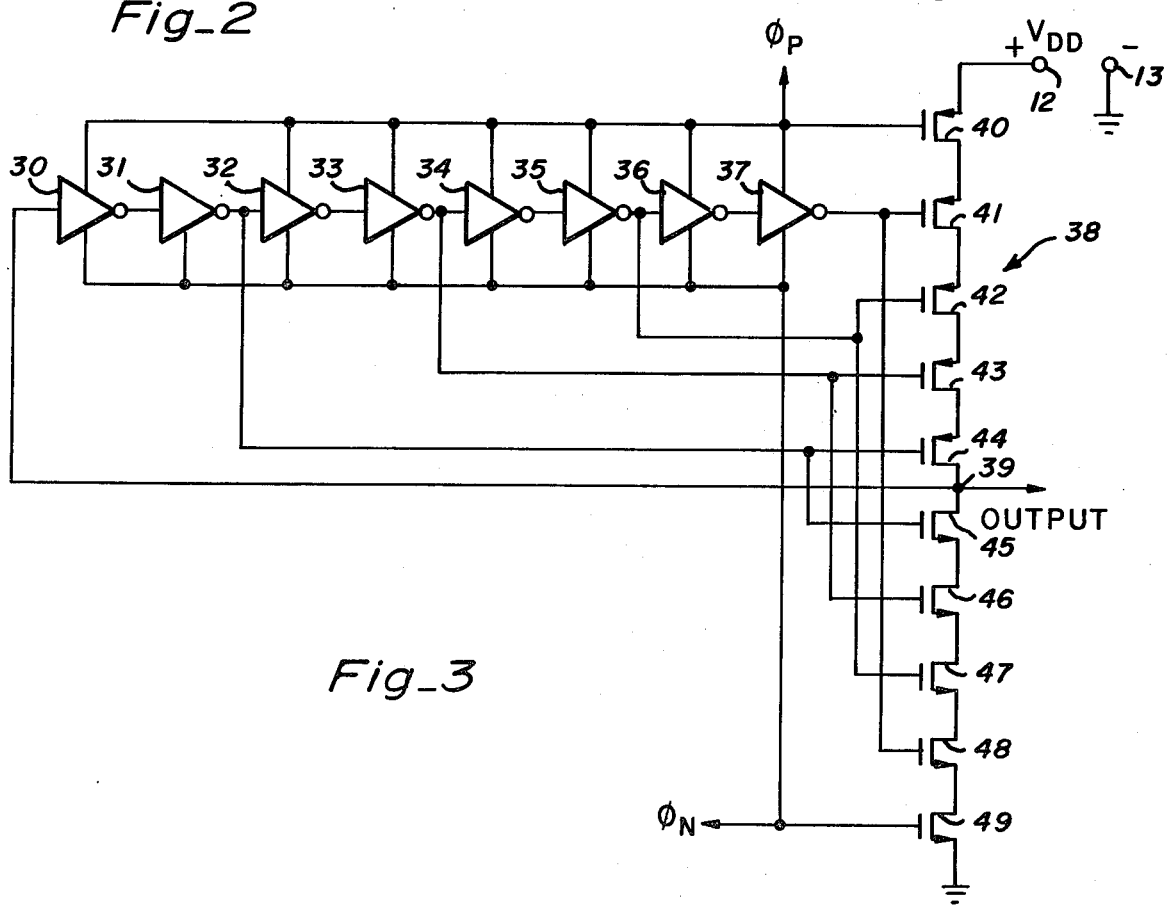
Fig_3

LOW POWER CMOS FREQUENCY DIVIDER

BACKGROUND OF THE INVENTION

The invention relates to complementary-metal-oxide-semiconductor (CMOS) devices that are commonly used in low-power integrated-circuit (IC) devices. Such devices have made possible a host of battery-operated systems such as watches and toys that draw so little current that a small battery will last for an extended period. For example a miniature single-cell battery will power a wristwatch for an entire year. High-energy cells will operate for several years.

While CMOS circuits require very little power, it has been found that certain inherent mechanisms require appreciable power in normal operation. For example, in a CMOS inverter gate the operation is most efficient when the applied voltage is equal to the sum of P and N channel device thresholds. When the supply exceeds this value, excess power is drawn because at its trip point such a gate is conductive. Power also is drawn by the charging and discharging of the output capacitance and is proportional to the frequency of the charge-discharge cycle. As the battery discharges, its voltage will slump with the end of life being a function of the lowest voltage at which the circuit will function. Clearly it is desirable to operate the CMOS circuitry at a battery voltage that is well above sum of thresholds. Thus, with a fresh battery, which has a relatively high voltage, the conventional CMOS circuits will draw an excess current.

In my copending application, Ser. No. 216,232, filed Dec. 15, 1980, and assigned to the assignee of the present invention, a low-power CMOS oscillator is described, in which the P and N-channel transistors are optimally biased for Class B operation. Such an oscillator will start and run at very low supply voltages, is itself very efficient and, as will be shown below, is an excellent source of clocking potentials.

SUMMARY OF THE INVENTION

It is an object of the invention to provide a CMOS frequency divider that requires very little operating power.

It is a further object of the invention to employ clocked inverters in cascade to form a shift register that will divide the clock frequency by a constant ratio.

It is a still further object of the invention to operate a clocked-inverter shift register in such a manner as to draw very little operating current and to divide the clock frequency by a predetermined ratio.

These and other objects are achieved using an oscillator that provides a pair of clock signal phases. The $\phi p$ phase has a base line at one P-channel-transistor threshold below the positive $V_{DD}$ supply potential. The $\phi n$ phase has a base line at one N-channel-transistor threshold above the negative ground terminal. When these phases are coupled to P and N-channel transistors, they conduct alternately in Class B operation. A clocked inverter is created using CMOS transistors, a pair of which are connected as a conventional inverter except that a clocking P-channel transistor is coupled between the source of the P-channel inverter and the $+V_{DD}$ terminal; a clocking N-channel transistor is coupled between the source of the N-channel inverter and the negative (ground) supply terminal. The clocking transistors are driven respectively from the $\phi p$ and $\phi n$ phases of the oscillator.

An even number of such clocked inverters are cascaded to form a shift register. The last inverter is coupled to a clocked output inverter, the output of which drives the input to the register which thus in total comprises an odd number of stages. One inverter is made to operate asynchronously in one direction by eliminating one of its clock transistors. The output stage includes additional series-connected complementary-transistor pairs which are gate coupled to respective inverter pairs in the register. This arrangement ensures that the transistors operate at a switching frequency that is a submultiple of the clock. The submultiple is equal to the number of inverters minus one.

BRIEF DESCRIPTION OF THE DRAWING

FIG. 1 is a schematic diagram of a CMOS oscillator capable of producing a pair of clock signal phases having the desired characteristics.

FIG. 2 shows a clocked inverter symbol and a schematic diagram of its CMOS equivalent.

FIG. 3 is a schematic diagram of the frequency divider of the invention.

FIG. 4 is a schematic diagram of an alternative embodiment of the output stage of the circuit of FIG. 3.

DESCRIPTION OF THE INVENTION

FIG. 1 shows the basic low-power oscillator circuit of copending patent application Ser. No. 216,332, filed Dec. 15, 1980. A P-channel transistor 10 and N-channel transistor 11 are series coupled between $+V_{DD}$ terminal 12 and ground terminal 13. The transistor gates are A.C. coupled together by capacitor 14. A crystal resonator 15 is coupled between output node 16 and the gate of transistor 11 to create an oscillator. Capacitors 17 and 18 form the required tuning elements for the oscillator and one or both (as shown) will be made adjustable for trimming oscillator frequency. It is to be understood that crystal 15 could instead be connected to the gate of transistor 10 if desired.

High value resistor 19 biases the gate of transistor 11 at one threshold above ground. $V_T$ Reference 21, via high value resistor 20, biases the gate of transistor 10 at one P-channel transistor threshold below $V_{DD}$. This circuit ensures that each device is optimally biased Class B. One very advantageous characteristic of the circuit is that if the gate (or gates) of other P channel transistors are connected to the gate of transistor 10, they too will be optimally biased and driven in Class B. So too will any N channel transistor (or transistors) with a gate (or gates) connected to the gate of transistor 11. If such additional N or P channel transistors are connected to the oscillator via the lines designated $\phi p$ and $\phi n$, the added capacitance will merely become part of capacitor 18 and no signal loading will be incurred upon the oscillator.

In operation, the oscillator will operate at a frequency F determined by the character of resonator 15. This frequency can be trimmed slightly by varying the values of capacitors 17 and 18. The signals at $\phi p$ and $\phi n$ will be in-phase sine waves which have base lines respectively at one P channel threshold below $V_{DD}$ and one N channel threshold above ground. While these signals are relatively small, they will be adequate to turn P and N channel transistors on for one half of the cycle period. Thus, the effect will be to render the P and N channel devices alternately (but not simultaneously)

conductive. The same is true of any parallel connected transistors.

FIG. 2 shows a clocked inverter that is adapted for operation with the oscillator of FIG. 1. The symbol at the left represents the inverter of the circuit at the right. The inverter will be operated from $+V_{DD}$ at terminal 12 with reference to ground terminal 13. Two P channel transistors 25 and 26 are coupled in series with two N channel transistors 27 and 28 across the power supply. Transistor 25 is gate driven from $\phi p$ and transistor 28 is gate driven from $\phi n$. The gates of transistors 26 and 27 comprise the inverter input while their drains comprise the output terminal. When such an inverter is driven from the oscillator of FIG. 1, its output can only switch high during the $\phi p$ period of the oscillator and low during the $\phi n$ period of the oscillator. While the input and output terminals of the FIG. 2 inverter can switch between the power supply rail voltages, the switching will only occur synchronously with the oscillator. Since only one of transistors 25 and 28 will be on at a time, there will be no power drain due to direct current flow as is the case in a conventional CMOS inverter. The only power supplied will involve the charging and discharging currents associated with the capacitance coupled to the transistor drain electrodes. The power drawn by such a circuit is related as follows:

$$P_L = CV^2F \qquad (1)$$

where $P_L$ is the power drawn by the circuit due to output load capacitance

V is the supply voltage

C is the load capacitance

F is the switching frequency

FIG. 3 shows a shift register that uses the synchronous inverter of FIG. 2 in such a way that the power drain is negligible when compared with the power drain of a single conventional CMOS inverter driven from an oscillator. A cascade of eight such inverters 30-37 is shown driving an output inverter 38. Thus, an odd number of inverters has its output at node 39 coupled back to the input of inverter 30. Such an array forms a shift register that will switch at a rate of $F/(N-1)$ where N is the number of inverters. Thus, the switching rate of FIG. 3 will one eighth of F. For such a configuration, the power drain due to capacitance charging will be reduced to a negligible value. First the switching rate has been reduced by a factor of eight to one. Second minimum geometry transistors can be used so that the C of formula (1) is minimal.

It will be noted that output stage 38 is made up of four P channel transistors 41-44 which couple to alternate nodes of inverters 30-37. The same nodes are coupled to the gates of four N channel transistors 45-48 as shown. P channel transistor 40 and N channel transistor 49 alternately gate output-gate 38 at the oscillator frequency F. While node 39 is shown as the output node, the output can actually be taken at any inverter output because the signal frequency at any of these will be at F/8.

The P-channel clock transistor of inverter 31 is shown omitted. Actually in this inverter, the source of the inverter P channel transistor is returned to $V_{DD}$ directly so that its positive-going output transition will asynchronously propagate. Actually, any of inverters 30-37 could be so treated. Also, the asynchronous effect could be created by omitting one of the N channel clocking transistors.

While a nine-inverter shift register is shown, more or fewer stages could be employed by adding or subtracting pairs of synchronous inverters as desired. Each pair added or subtracted would include an equivalent pair of transistors in output stage 38. While the power drain could be further reduced by increasing the number of stages to further reduce F, the effect of diminishing returns sets in. At the present time, there appears to be little to be gained by going beyond the nine stage device illustrated.

Typically, the circuit will be employed to divide the frequency of a quartz crystal oscillator. The divider output will then be coupled to a conventional CMOS divider chain to further reduce the frequency to the desired value. By using the oscillator of FIG. 1, along with a divider as shown in FIG. 3, the current drain of a CMOS watch circuit can be reduced by a factor of 10 over that of a conventional oscillator-divider combination.

FIG. 4 shows an alternative output-stage configuration 38' for the divider of FIG. 3. Three added N-channel transistors 51-53 have been coupled to the drains of P-channel transistors 41-43. As each of the P-channel transistors is turned off, its drain is forced to ground by the associated N-channel device.

Three additional P-channel transistors are also coupled to the drains of N-channel transistors 46-48. Thus, when the N-channel transistors are turned off, their drains are forced to $V_{DD}$ by the associated P-channel device. This provides a greatly cleaned up output waveform.

This arrangement acts to counter the tendency of the transistor drains to redistribute their charge values during their off periods. Since the circuit of FIG. 4 only requires six additional minimum geometry transistors, its performance is considered to be well worth the added IC chip area required.

The invention has been described and an alternative embodiment detailed. Clearly, there are other alternatives and equivalents that will occur to a person skilled in the art upon reading the foregoing. Accordingly, it is intended that the scope of the invention be limited only by the following claims.

I claim:

1. A CMOS frequency divider comprising:

an even number (K) greater than two of cascaded inverters, each one comprising first and second P channel transistors, third and fourth N channel transistors, means for coupling the source-drain circuits of said P and N channel transistors in series across first and second power supply rails connectable to a source of operating power, means for coupling the gates of said second and third transistors to an inverter input terminal, means for coupling the drain electrodes of said second and third transistors to an inverter output terminal and clock means for alternately switching said first and fourth transistors between conductive and nonconductive states;

means for bypassing one of said first and fourth transistors in at least one of said inverters by connecting the respective drain to the respective source of said one transistor;

a combining clocked inverter having K/2 inputs coupled respectively to alternate outputs of said cascaded clocked inverters and an output coupled to the input of the first of said cascaded clocked inverters, said combining clocked inverter comprising:

K/2 plus one P channel transistors and K/2 plus one N channel transistors, having their source-drain circuits coupled in series between said power supply rails;

means for coupling the gate electrodes of the P and N channel transistors that have their sources coupled directly respectively to said first and second power supply rails to said clock means for alternately switching said first and fourth transistors; and means for coupling each of the gates of the remainder of said P channel transistors to a corresponding one of the remainder of said N channel transistor gates, to provide said K/2 inputs.

2. The frequency divider of claim 1, further comprising:

K/2 minus one additional P channel transistors having their source electrodes coupled to the positive of said power supply rails, their respective gate electrodes coupled to the gate electrodes of said N channel transistors that comprise the input terminals of said combining clocked inverter except for that N channel transistor having its drain coupled directly to said combining clocked inverter output, and their drain electrodes coupled to the respective drain electrodes of said N channel transistor drain electrodes; and K/2 minus one additional N channel transistors, having their source electrodes coupled to the negative of said power supply rails, their respective gate electrodes coupled to the gate electrodes of said P channel transistors that comprise the input terminals of said combining clocked inverter except for that P channel transistor having its drain coupled directly to said combining clocked inverter output, and their drain electrodes coupled to the respective drain electrodes of said P channel transistors.

* * * * *